US006902990B2

(12) United States Patent
Gottfried et al.

(10) Patent No.: US 6,902,990 B2
(45) Date of Patent: Jun. 7, 2005

(54) SEMICONDUCTOR DEVICE SEPARATION USING A PATTERNED LASER PROJECTION

(75) Inventors: Mark Gottfried, Bridgewater, NJ (US); Michael G. Brown, Clinton, NJ (US); Ivan Eliashevich, Millburn, NJ (US); Robert F. Karlicek, Jr., Flemington, NJ (US); James E. Nering, Summit, NJ (US)

(73) Assignee: Emcore Corporation, Somerset, NJ (US)

( * ) Notice: Subject to any disclaimer, the term of this patent is extended or adjusted under 35 U.S.C. 154(b) by 42 days.

(21) Appl. No.: 10/114,099

(22) Filed: Apr. 2, 2002

(65) Prior Publication Data

US 2002/0177288 A1 Nov. 28, 2002

Related U.S. Application Data

(63) Continuation of application No. 09/178,287, filed on Oct. 23, 1998, now Pat. No. 6,413,839.

(51) Int. Cl.[7] .................... H01L 21/301; H01L 21/406
(52) U.S. Cl. ..................................................... 438/463
(58) Field of Search ......................... 438/463, 460, 438/33, 462, 113, 114, 940

(56) References Cited

U.S. PATENT DOCUMENTS

| 3,629,545 A | 12/1971 | Graham et al. |
| 3,699,644 A | 10/1972 | Cocca |
| 3,824,678 A | 7/1974 | Harris et al. |

(Continued)

FOREIGN PATENT DOCUMENTS

| JP | 61219535 | 9/1986 |
| JP | 63174793 | 7/1988 |
| JP | 63183885 | 7/1988 |

OTHER PUBLICATIONS

Jeffery P. Sercel, "Increased Production Using Excimer Lasers Through Enhanced Beam Utilization Factors", SPIE Photonics West Conference, Jan. 26–28, 1998.
Sercel, J.P. (JP Sercel Associates Inc., Hollis, NH, USA) "Increased production using excimer lasers through enhanced beam utilization factors." Proceedings of the SPIE–The International Society for Optical Engineering (1998) vol. 3274, pp. 183–92.*
Published by: SPIE–Int. Soc. Opt. Eng. Price: CCCC 0277–786X/98/$10.00. CODEN: PSISDG ISSN: 0277–786X. SICI: 0277–786X(1998)3274L.183:IPUE;1–G. Conference: Laser Applications in Microelectronic and Optoelectronic Manufacturing III. San Jose, CA USA, Jan. 26–28, 1998.*

*Primary Examiner*—Craig A. Thompson
(74) *Attorney, Agent, or Firm*—Gibbons, Del Deo, Dolan, Griffinger & Vecchione

(57) ABSTRACT

A method for separating a semiconductor wafer into several thousand devices or dies by laser ablation. Semiconductor wafers are initially pre-processed to create multiple devices, such as blue LEDs, on the wafers. The wafers are then mounted with tape coated with a generally high level adhesive. The mounted wafer is then placed on a vacuum chuck (which is itself positioned on a computer controlled positioning table) to hold it in place during the cutting process. The cutting surface is then covered with a protective layer to prevent contamination from the effluent resulting from the actual cutting process. A laser beam is generated and passed through optical elements and masks to create a pattern, such as a line or multiple lines. The patterned laser projection is directed at the wafer at a substantially normal angle and applied to the wafer until at least a partial cut is achieved through it. A mechanical separation process completes the separation when only a partial cut is achieved by the patterned laser projection. The dies are then transferred to a grip ring for further processing.

27 Claims, 8 Drawing Sheets

U.S. PATENT DOCUMENTS

| | | |
|---|---|---|
| 3,970,819 A | 7/1976 | Gates et al. |
| 4,046,985 A | 9/1977 | Gates |
| 4,224,101 A | 9/1980 | Tijburg et al. |
| 4,543,464 A | 9/1985 | Takeuchi |
| 4,729,971 A | 3/1988 | Coleman |
| 4,851,371 A | 7/1989 | Fisher et al. |
| 4,865,686 A | 9/1989 | Sinohara |
| 4,964,212 A | 10/1990 | Deroux-Dauphin et al. |
| 4,992,393 A | 2/1991 | Kosaka et al. |
| 5,075,201 A | 12/1991 | Koh |
| 5,151,389 A | 9/1992 | Zappella |
| 5,185,295 A | 2/1993 | Goto et al. |
| 5,214,261 A * | 5/1993 | Zappella ............ 219/121.67 |
| 5,385,633 A | 1/1995 | Russell et al. |
| 5,543,365 A | 8/1996 | Wills et al. |
| 5,552,345 A | 9/1996 | Schrantz et al. |
| 5,631,190 A | 5/1997 | Negley |
| 5,641,416 A | 6/1997 | Chadha |
| 5,864,171 A | 1/1999 | Yamamoto et al. |
| 5,872,046 A | 2/1999 | Kaeriyama et al. |
| 5,912,477 A | 6/1999 | Negley |
| 5,922,224 A | 7/1999 | Broekroelofs |
| 5,932,118 A | 8/1999 | Yamamoto et al. |
| 5,976,691 A | 11/1999 | Noguchi et al. |
| 6,117,347 A | 9/2000 | Ishida |
| 6,140,151 A | 10/2000 | Akram |
| 6,225,194 B1 | 5/2001 | Noguchi et al. |

* cited by examiner

500

600

SEMICONDUCTOR DEVICE SEPARATION USING A PATTERNED LASER PROJECTION

This application is a continuation of the application Ser. No. 09/178,287, now Pat. No. 6,413,839, filed on Oct. 23, 1998, entitled "SEMICONDUCTOR DEVICE SEPARATION USING A PATTERNED LASER PROJECTION", herein incorporated by reference. This application is also related to co-pending U.S. patent application Ser. No. 10/114,275, entitled "SEMICONDUCTOR DEVICE SEPARATION USING A PATTERNED LASER PROJECTION," filed on Apr. 2, 2002 co-pending U.S. patent application Ser. No. 10/146,267, entitled "SEMICONDUCTOR DEVICE SEPARATION USING A PATTERNED LASER PROJECTION," filed on May 15, 2002 and co-pending U.S. patent application Ser. No. 10/137,904, entitled "SEMICONDUCTOR WAFER PROTECTION AND CLEANING FOR DEVICE SEPARATION USING LASER ABLATION," filed on May 2, 2002.

FIELD OF THE INVENTION

This invention relates to the field of semiconductor fabrication, and more particularly to semiconductor device separation.

BACKGROUND OF THE INVENTION

Sapphire wafers are an important semiconductor substrate. They are especially important for the development of gallium nitride based materials technology, which is used in blue spectrum light emitting diodes (LEDs). The production of high brightness LEDs in the blue spectrum is a relatively recent optoelectronics technology. The demand for nitride based LEDs, such as bright blue, bright green and other color LEDs, currently exceeds the industry's capability to supply them. Sapphire based device separation, however, remains a significant obstacle to efficient fabrication. Current separation techniques waste valuable wafer surface area, involve costly consumables, and have long process times.

Semiconductor fabrication processes involve fabricating several thousand individual devices, or dies, on one wafer. After processing and testing, the wafer may be thinned and the dies must be separated from the wafer. Separation has been traditionally accomplished using either a dicing saw or a scribe-and-break process, both of which rely on diamond chips to cut the material. These two processes have been very effective on silicon and III–V substrates, because the material is much softer than diamond. However, sapphire's crystal structure, crystal orientation, inherent hardness, and material strength inhibit these methods from working well.

Specifically, the diamond's edge dulls quickly when applied to sapphire. To compensate, dicing saw blades designed to cut sapphire contain diamonds in a resin matrix. The dicing blades wear quickly to constantly expose new, sharp diamonds. Although processing times and the number of blades is dependent on die size, studies have shown that completely dicing a 17 mil thick sapphire substrate into 16 mil×16 mil die would require up to four blades and over 2 hours of process time and the maximum yield would be 25%. A 4 mil thick sapphire substrate completely shatters during dicing. These low yields make it difficult to meet commercial demand. The yields are low because the minimum blade thickness is 8 mil. This results in a kerf width of >0.010". Thinner blades, however, produce poor quality cuts. A significant amount of available device surface area is therefore wasted during wafer sawing.

The scribe-and-break separation process also relies on a sharp diamond edge or facet. The scribe tip has a diamond head which is quickly dulled by the sapphire. This requires frequent and costly tip replacement Due to these factors, a sapphire dicing process will produce too low a yield. Moreover, both the sawing and diamond scribing process become very complex due to diamond wear.

Another method for device separation is discussed in U.S. Pat. Nos. 5,151,389 and 5,214,261, both of which are issued to Zapella. These references discuss a method for dicing semiconductor substrates using an excimer laser beam. This method uses a laser beam that is oriented out of normal with respect to the substrate to ensure non-tapered cuts. A drawback of this method is that the substrate and the laser beams must be maintained within the critical out of normal ranges. A further drawback is that a polyimide coating is used to prevent "dust" from settling onto the surface. The removal of this coating via chemical peeling introduces the possibility of contamination.

SUMMARY OF THE INVENTION

The present invention is a method for efficient and inexpensive separation of semiconductor wafers by laser ablation. The method uses a laser to ablate material from the substrate, resulting in a separated wafer. Laser separation is advantageous because it permits processing of any sapphire based product, such as blue LEDs, inexpensively and quickly. Importantly, the separation methods are applicable to gallium arsenide (GaAs) and to other semiconductors with the same potential benefits of high throughputs, narrow kerfs and no cutting tips to wear.

In an exemplary embodiment, the method of the present invention separates semiconductor wafers into a plurality of devices via laser ablation. A laser light emission is generated and sent through optical elements and masks to obtain a patterned laser projection. The patterned laser projection is then directed toward a given surface of a semiconductor wafer such that the patterned laser projection is substantially perpendicular to the given surface. The patterned laser projection is applied for a specified time at a specified power to obtain at least a partial cut through the semiconductor wafer. If the wafers are not fully cut using the laser, a mechanical method is then applied to complete the separation and create the die.

Advantageously, the pattern of the laser projection can be selected in view of the type of semiconductor wafer. For example, the patterned laser projection of the present invention can be one long, narrow line that cuts several millimeters with one pulse or several smaller lines that cut several rows simultaneously with one pulse. Moreover, a protective layer is applied to the cutting surface to prevent cutting process effluent from contaminating the devices.

The method of the present invention results in a kerf in the order of 10 μm wide if cut from a front surface and less than 10 μm if cut from a back or substrate surface. Consequently, the present invention reduces wastage of wafer space and permits more devices to be placed on the wafer. The above factors make the present invention an efficient, low maintenance and high production method for separating semiconductor wafers. Such a method is a significant step toward meeting the demand for sapphire based devices.

BRIEF DESCRIPTION OF THE DRAWINGS

A more complete understanding of the present invention may be obtained from consideration of the following description in conjunction with the drawings in which.

DETAILED DESCRIPTION

The following description is presented to enable a person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and the scope of the invention. Thus, the present invention is not intended to be limited to the embodiments disclosed, but is to be accorded the widest scope consistent with the principles and features disclosed herein.

For purposes of clarity, a top-level functional overview of the present invention is presented, followed by an exemplary embodiment of a laser-based semiconductor separation system incorporating the methodology of the present invention. A more detailed explanation of the methodology is then presented.

In general, the method of the present invention separates a semiconductor wafer into several thousand devices or die by laser ablation. Semiconductor wafers are initially pre-processed to create multiple devices, such as blue LEDs, on the wafers. The wafers are then mounted with tape coated with a generally high level adhesive. The mounted wafer is then placed on a vacuum chuck (which is itself positioned on a computer controlled positioning table) to hold it in place during the cutting process. The cutting surface is then covered with a protective layer to prevent contamination from the effluent resulting from the actual cutting process. A laser light emission is generated and passed through optical elements and masks to create a pattern, such as a line or multiple lines. The patterned laser projection is directed at the wafer at a substantially normal angle and applied to the wafer until at least a partial cut is achieved through it. A mechanical separation process completes the separation when only a partial cut is achieved by the patterned laser projection. The die are then transferred to a grip ring for further processing.

Figure 1:
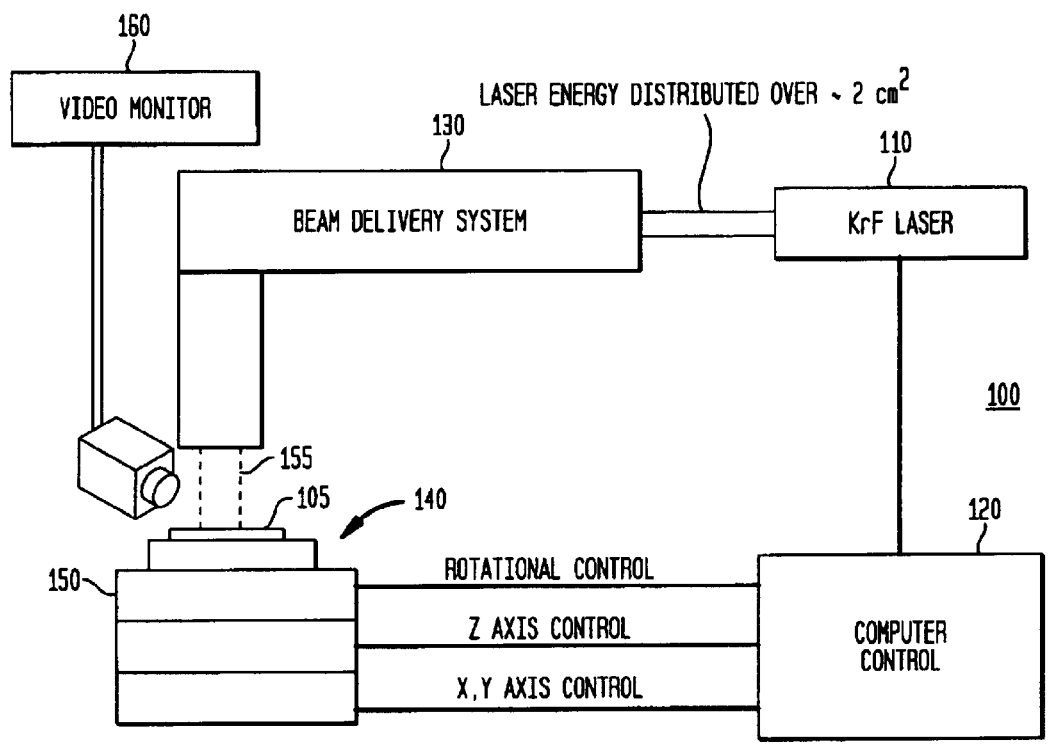
FIG. 1 is an exemplary embodiment of a laser-based semiconductor separation system in accordance with the present invention.

Referring to FIG. 1, there is shown an exemplary embodiment of a laser-based separation system 100 that can be used in conjunction with the method of the present invention to separate a semiconductor wafer 105. System 100 includes a laser 110 coupled to a computer control 120 and a projection delivery system 130. Laser 110 is any laser that has the necessary parameters, for example, power, wavelength and frequency, to cut semiconductor wafers, such as but not limited to KrF lasers, Nd:YAG lasers, and other lasers.

Figure 2:
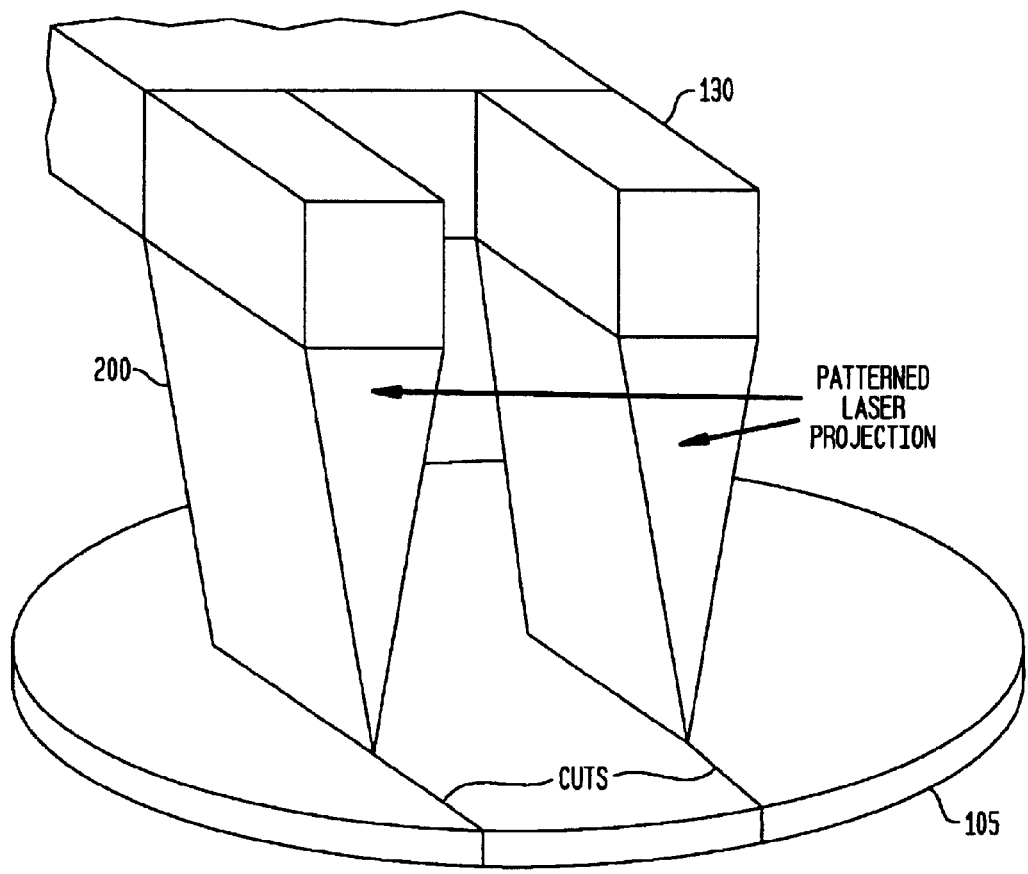
FIG. 2 shows a more detailed view of a projection delivery system outputting a patterned light projection onto a surface of a semiconductor wafer in accordance with the present invention.

As shown in more detail in FIG. 2, projection delivery system 130 uses optical elements and masks to shape the laser light emission into a pattern 200 that will optimize the cutting process on semiconductor wafer 105. The optimal pattern may be either one long, narrow line that will cut several millimeters of the surface up to 100 µm deep with each pulse, or several smaller lines that will cut several rows simultaneously with each pulse. Other patterns, such as a grid pattern can also be used. The optimal configuration depends on the type of semiconductor wafer being separated.

Referring also to FIG. 1, semiconductor wafer 105 is situated on a vacuum chuck 140 to hold semiconductor wafer 105 in place during the cutting process. Moreover, as explained below, vacuum chuck 105 flattens the shape of semiconductor wafer 105 during the cutting process. Vacuum chuck 140 is situated on a xyz theta positioning table 150. Computer control 120 controls the movement of xyz theta positioning table 150 with respect to patterned light projection 155 so as to place the cuts in the correct areas. As the name of the table implies, computer control 120 moves semiconductor wafer 105 in the x, y and z axes and rotates it a given θ. This, along with video monitor 160 provides accurate control and placement of where patterned light projection 155 will cut semiconductor wafer 105.

Given the above laser-based semiconductor separation system, a more detailed explanation of the method of the present invention is presented. This explanation is given with respect to FIG. 3, which shows a cross-sectional view of a processed semiconductor wafer 300 and FIG. 4, which illustrates graphically some of the steps in the method of the present invention.

Although the following description primarily refers to cutting gallium nitride (GaN) on C-plane sapphire, these are only illustrative materials. The epitaxial growth material can be, for example, any semiconductor material such as any of the III–V materials listed in the periodic chart of elements. The substrate material can be, for example, any of the III–V materials, refractory ceramics and any orientations of any of the listed substrate materials.

Figure 3:
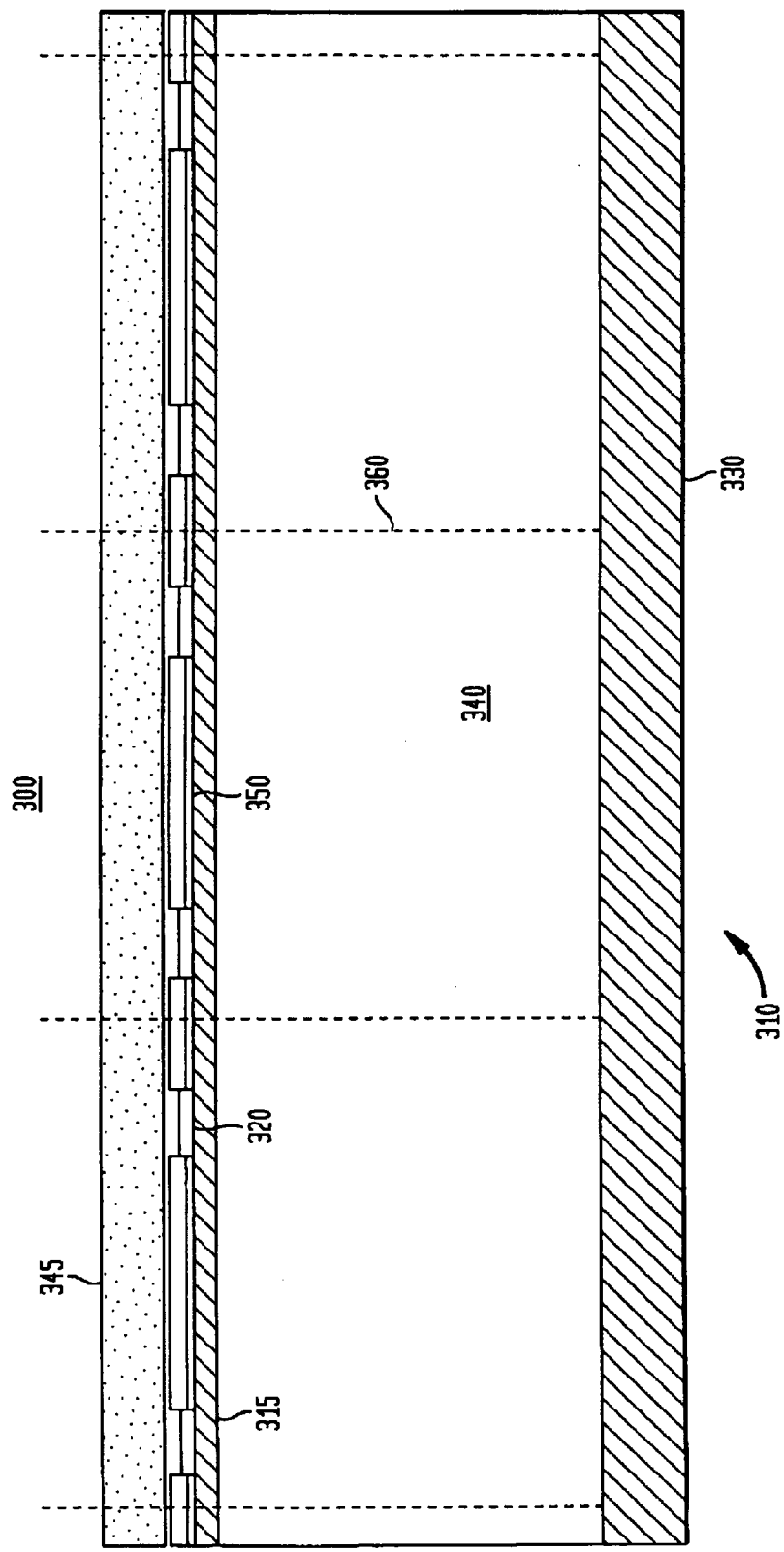
FIG. 3 shows a cross-sectional view of a semiconductor wafer in accordance with the present invention.

Referring now to FIG. 3, a semiconductor wafer 300 has a front surface 305, which is also referred to as the epi or epitaxial surface, and a back surface 310, which is also referred to as the substrate surface. Prior to cutting, GaN layer 315 will have been etched and coated with three metal patterns 320 and a dielectric 350. Sapphire substrate 340 may be thinned from 0.017" to 0.004". The processing creates approximately 11000 devices on a 2" diameter wafer. Due to lattice mismatch in the GaN/sapphire structure, the resulting stress in the structure causes the wafer to "bow", such that it resembles a potato chip.

The bow in the wafer is flattened by a process termed wafer mounting. The wafer mounting process is also required to keep the 11000 individual devices in order. In an exemplary embodiment, wafer 300 is mounted on 0.003" to 0.005" thick tape 330 coated with a generally high tack adhesive. The mounting process is outlined below:

1. Place wafer on mounting station.
2. Center dicing ring (which is a 9" outer diameter, 8" inner diameter and 0.10" thick metal ring) around wafer.
3. Place a sheet of tape over wafer and ring.
4. Press tape onto ring and wafer.
5. Place a sheet of wax paper over the mounting structure (the adhesive side of the tape, wafer, and ring).
6. Cut out the center of the wax paper so the wafer is exposed.
7. Place mounting structure, wafer side up, on a vacuum chuck, which holds the structure in place and removes the wafer's bow.

Note that the vacuum chuck can either be porous ceramic or contain concentric metal rings. The latter may require a backing so the ring pattern is not pressed into the tape.

Because mounting tape 330 is used, the parameters of the patterned laser projection are set in one embodiment of the method to achieve only a partial cut through the device. A mechanical breaking process is used to complete the separation. If a full or total cut through the wafer is desired, another, layer must adhered on to the bottom of the mounting tape. This layer, for example, could be an epoxy or double sided tape.

Prior to the wafer mounting process, however, the user must decide which surface of the wafer to cut on. Whether to cut on the front surface or the back may depend upon the cut width or kerf that is produced for the particular type of wafer being cut. To minimize wafer wastage, the kerf value should be on the order of 10 $\mu$m wide. For example, front and back surface cuts should have kerf values of less than 100 $\mu$m. For the illustrative GaN/sapphire structure, the kerf value is 20 $\mu$m when cutting from the front surface and less than 10 $\mu$m when cutting from the back surface. However, there are additional considerations that must be accounted for before deciding on which surface to cut on.

Referring to Table 1, although cutting from the back surface results in a low kerf value, the resulting device edges are rough. This may decrease the performance of the device. With regard to blue LEDs, this means that the light output may be decreased. In contrast, the device edges are cleaner when cutting from the front surface. Consequently, this can increase the light output for the blue LEDs.

TABLE 1

Front Surface and Back Surface Cutting

| Cut surface | Advantages | Disadvantages |
|---|---|---|
| Front - GaN surface. | Produces cleaner cut on device edge, which increases light output | Wider kerf (20 $\mu$m) |
| Back - sapphire surface | Small kerf (<10 $\mu$m) because we are breaking through GaN surface | Device edge rough, which may decrease light output. |

Once the cutting surface has been selected, a protective layer must be placed on it. Studies have shown that the cutting process coats the wafer's surface with effluent, which is unacceptable. Generally, the wafer's surface is protected with either photoresist or polyimide during a laser separation process, and the coating is removed with a solvent after the process. This is not possible in the present case because the solvent may damage mounting tape 330. The contamination problem is overcome by covering the cutting surface with a generally lower tack mounting tape 345. This provides excellent protection from effluent. Two pieces of tape were used for each wafer-one for X direction cutting and one for Y direction cutting.

Once the wafer is mounted and taped, it is placed on positioning table 150. Laser 110, for example, a KrF laser operating at 248 nm or a Nd:YAG operating at 1064 nm, is activated to generate laser light emission operable to cut the semiconductor wafer. The laser light emissions are fed through projection delivery system 130 to produce a pattern. The patterned light projection is then directed toward a selected cutting surface of the wafer so that it is substantially normal to the cutting surface. For example, the incidence angle should have a magnitude of less than 4°.

The parameters of the laser, such as cutting speed, laser power, laser pulse rate, number of cuts, cut depth, etc., are set to achieve the required cut without inducing cracking and chipping. Studies using several types of laser sources have indicated that multiple shallow cuts, for example, cut depths of one mil to three mils for a 13 mil thick wafer, are required to separate sapphire based substrates without cracking. In contrast, deep cuts, for example, a 6 mil deep cut, caused cracks in the wafer. Studies have also shown that cut depths of 45 $\mu$m leave very little effluent on the surface. As stated above, this is a very important consideration in terms of contamination of the separated devices. In addition, the parameters are also set to achieve the desired partial or full cut through the wafer. FIG. 3 illustrates exemplary cuts 360.

Figure 4:
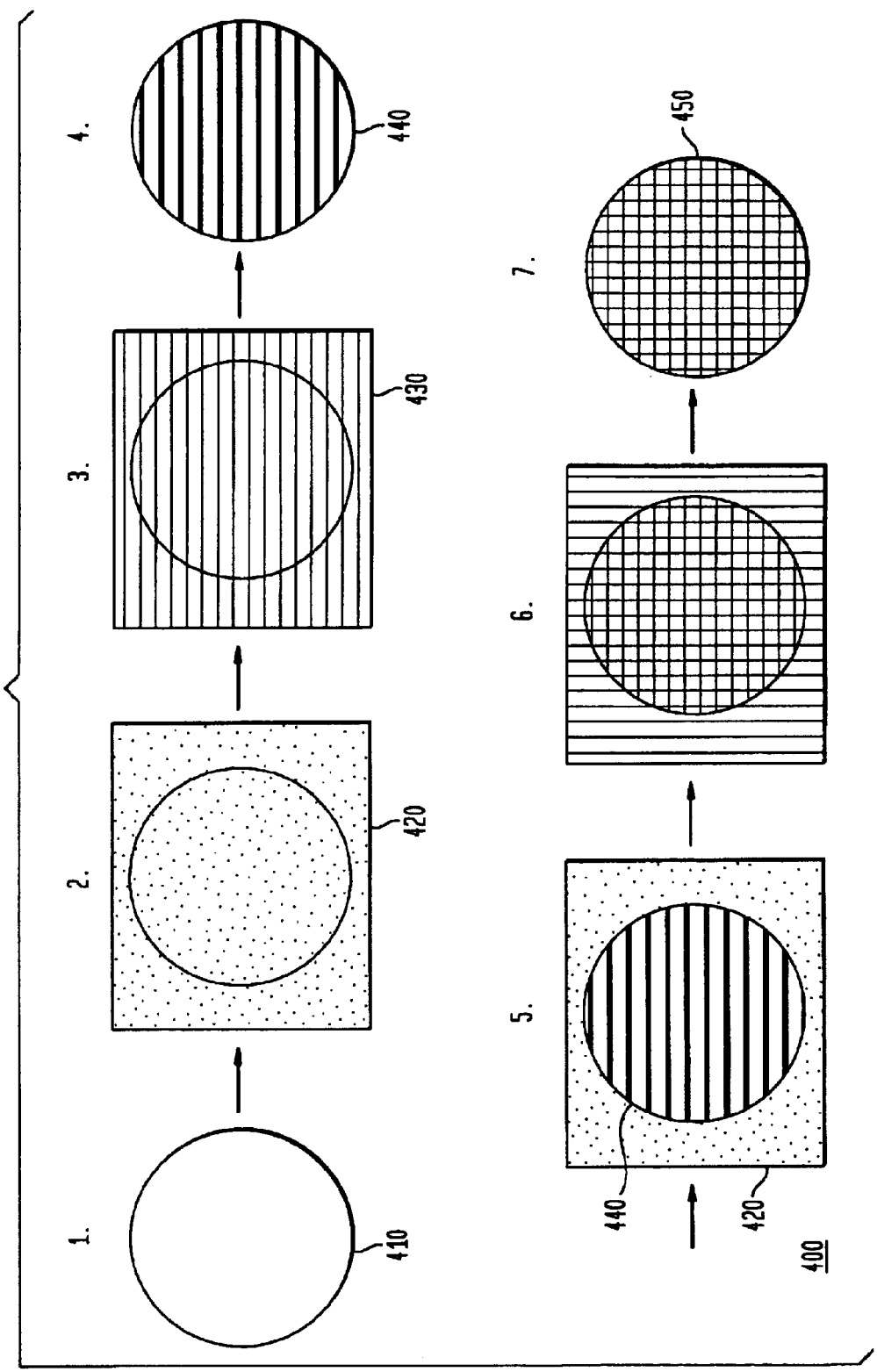
FIG. 4 graphically shows the steps involved in the method of the present invention.

Referring now to FIG. 4, a graphical representation 400 of how a wafer is cut is shown. Starting with a mounted uncut wafer 410 (step 1), tape 420 is placed on the cutting surface of wafer 410 (step 2). Taped wafer 430 is cut in the X direction (step 3) and the excess tape is removed (step 4). X cut wafer 440 is again covered with tape 420 (step 5) and is now cut in the Y direction (step 6). The excess tape is removed, leaving at least a partially cut wafer 450 (step 7).

Figure 5:
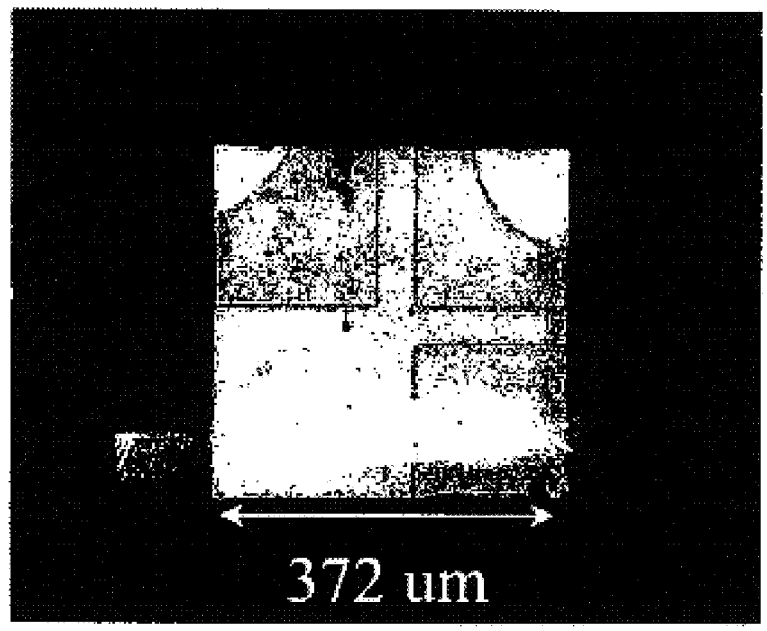
FIG. 5 shows one laser cut die in accordance with the present invention.
Figure 6:
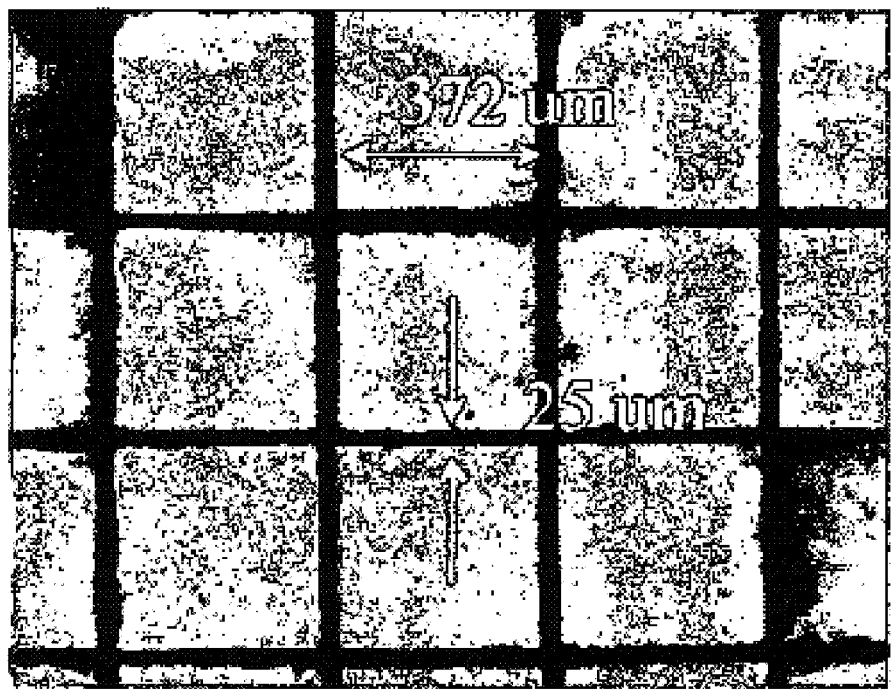
FIG. 6 shows a plurality of laser cut die in accordance with the present invention.
Figure 7:
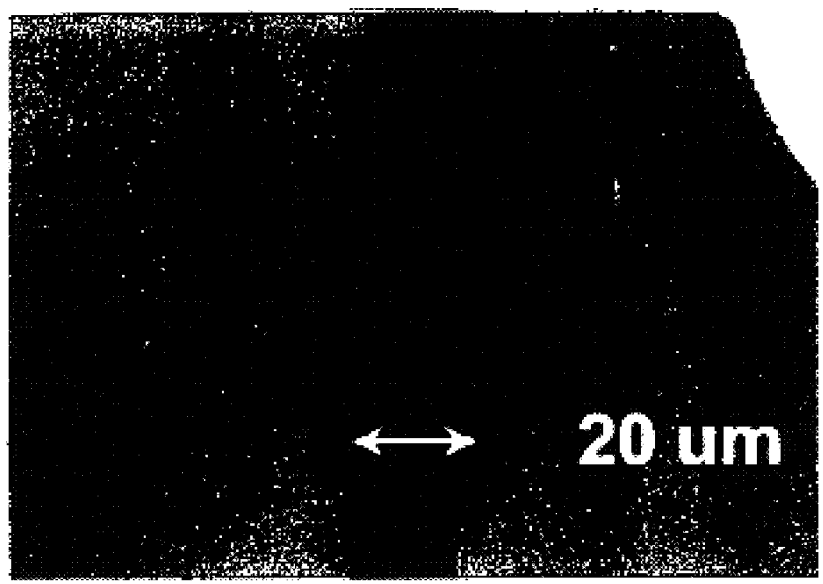
FIG. 7 shows a laser cut in GaN in accordance with the present invention.
Figure 8:
FIG. 8 shows a scanning electron microscope photo of a laser cut die in accordance with the present invention.

Referring now to FIGS. 5–6, the above method separates the entire wafer into square die. In an exemplary cut, the cuts are on 400 $\mu$m centers, in the X and Y directions. The cut depths are roughly 85 $\mu$m. The remaining 15 $\mu$m is mechanically broken using conventional techniques. A single laser cut die 500 is shown in FIG. 5 and a plurality of die 600 are shown in FIG. 6. As indicated, the actual die size is 372 $\mu$m with a kerf width of approximately 25 $\mu$m. Moreover, these photos show that the edges resulting from the laser cuts are sharp. FIG. 7 is an example of a laser cut in GaN that has a kerf width of 20 $\mu$m and FIG. 8 shows a scanning electron microscope photo of characteristic features of a laser cut surface.

After cutting, the wax paper is removed and the cut quality is inspected. The next steps depend on the wafer's orientation during cutting. If the wafer was mounted with the GaN surface on the mounting tape and cut from the back surface, the individual die must be remounted on tape with the GaN surface facing up. That is done using the following process:

1. Cover the mounting tape with clean wax paper.
2. Cut a hole in the wax paper to expose the wafer.
3. Cover the wafer, wax paper, and the ring with a tape that has higher adhesion than the tape on which the wafer was cut.
4. Wait until the adhesive strength of the new tape maximizes.
5. Peel off the tape on which the wafer was cut.
6. Transfer the wafer to a grip ring using commercial equipment.

If the wafer was cut from the GaN surface and the mounting tape was not damaged, then the wafer and the tape on which it was cut is transferred to a grip ring. If the mounting tape was damaged, then two tape transfers are necessary. The first would place the die, GaN surface down, on a medium tack tape, and the second would place the die, GaN surface up, on a high tack tape.

In accordance with the present invention, there has been described a method for separating a semiconductor wafer using a patterned laser projection. The patterned laser is incident substantially normal to a cutting surface of the wafer. The parameters of the laser system are set to maximize throughput without inducing damage to the wafer. The wafer itself is protected from cutting process effluent by the placement of a generally low tack adhesive tape on the cutting surface.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications which come within the scope of the appended claim is reserved.

What is claimed:

1. A method for scribing a semiconductor wafer, said method comprising the steps of:
   directing a patterned laser projection at a surface of said semiconductor wafer, said semiconductor wafer comprising a sapphire substrate and a device layer; and
   applying said patterned laser projection with a given set of parameters until at least a partial cut in said semiconductor wafer is obtained.

2. The method of claim 1, wherein said device layer comprises a nitride device layer.

3. The method of claim 1, wherein said sapphire substrate has a bandgap value greater than an energy value for the patterned laser projection.

4. The method of claim 1, wherein said sapphire substrate has a C-plane orientation.

5. The method of claim 1, wherein said patterned laser projection is one selected from the group consisting of long lines, multiple lines, multiple parallel lines and grids.

6. The method of claim 1, wherein said surface is a back/substrate surface of said semiconductor wafer.

7. The method of claim 1, wherein said surface is a front/epitaxial surface of said semiconductor wafer.

8. The method of claim 1, wherein a kerf width is less than 10 micrometers for minimizing wastage of said semiconductor wafer.

9. The method of claim 1, wherein a kerf width is less than 20 micrometers for minimizing wastage of said semiconductor wafer.

10. The method of claim 1, wherein a kerf width is less than 100 micrometers for minimizing wastage of said semiconductor wafer.

11. The method of claim 1, wherein a kerf width is less than 20 micrometers and no more than 28 micrometers for minimizing wastage of the semiconductor wafer.

12. The method of claim 1, wherein said partial cut is less than 3.5 mils in depth.

13. The method of claim 1, wherein said step of directing includes the step of generating laser light emissions capable of cutting the sapphire substrate via laser ablation.

14. The method of claim 1, wherein said device layer comprises gallium nitride.

15. The method of claim 1, wherein said device layer comprises gallium arsenide.

16. The method of claim 1, wherein said device layer comprises aluminum nitride.

17. The method of claim 1, wherein said device layer comprises indium nitride.

18. The method of claim 1, wherein said device layer comprises silicon.

19. The method of claim 1, wherein said device layer comprises III–V material.

20. A method for scribing a semiconductor wafer, said method comprising the steps of:
    directing a patterned laser projection at a surface of said semiconductor wafer, said semiconductor wafer comprising a sapphire substrate and a device layer; and
    applying said patterned laser projection with a given set of parameters until at least a partial cut in said semiconductor wafer is obtained,
    wherein said patterned laser projection is incident substantially normal with said surface.

21. The method of claim 20, wherein said device layer comprises a nitride device layer.

22. The method of claim 20, wherein said sapphire substrate has a bandgap value greater than an energy value for the laser projection.

23. The method of claim 20, wherein said sapphire substrate has a C-plane orientation.

24. The method of claim 20, wherein said patterned laser projection is one selected from the group consisting of long lines, multiple lines, multiple parallel lines and grids.

25. The method of claim 20, wherein said step of applying further includes the step of positioning a positioning table with respect to said laser projection to permit cutting along different axes and different sections of said semiconductor wafer.

26. The method of claim 20, wherein a magnitude of an incidence angle between said laser projection and said surface is less than 4°.

27. The method of claim 20, wherein said semiconductor wafer has a substrate selected from the group consisting of sapphire, III–V materials, and refractory ceramics.

* * * * *